(12) United States Patent
Shibata et al.

(10) Patent No.: US 8,607,732 B2
(45) Date of Patent: Dec. 17, 2013

(54) IN-LIQUID PLASMA FILM-FORMING APPARATUS, ELECTRODE FOR IN-LIQUID PLASMA, AND FILM-FORMING METHOD USING IN-LIQUID PLASMA

(75) Inventors: Kenji Shibata, Kariya (JP); Toshihisa Shimo, Kariya (JP); Kyoko Kumagai, Kariya (JP); Hidetaka Hayashi, Kariya (JP); Shinya Okuda, Kariya (JP); Shinfuku Nomura, Matsuyama (JP); Hiromichi Toyota, Matsuyama (JP)

(73) Assignees: Kabushiki Kaisha Toyota Jidoshokki, Aichi-ken (JP); National University Corporation Ehime University, Ehime-ken (JP)

( * ) Notice: Subject to any disclaimer, the term of this patent is extended or adjusted under 35 U.S.C. 154(b) by 828 days.

(21) Appl. No.: 12/671,773

(22) PCT Filed: Mar. 2, 2009

(86) PCT No.: PCT/JP2009/054365
§ 371 (c)(1),
(2), (4) Date: Feb. 2, 2010

(87) PCT Pub. No.: WO2009/110625
PCT Pub. Date: Sep. 11, 2009

(65) Prior Publication Data
US 2011/0229656 A1  Sep. 22, 2011

(30) Foreign Application Priority Data
Mar. 7, 2008 (JP) .................. 2008-057890
Sep. 16, 2008 (JP) .................. 2008-236934

(51) Int. Cl.
C23C 16/00 (2006.01)
C23F 1/00 (2006.01)
H01L 21/306 (2006.01)

(52) U.S. Cl.
USPC ............. 118/723 E; 118/715; 118/723 R; 156/345.4

(58) Field of Classification Search
USPC .......... 118/715, 722, 723 R, 723 EB, 723 FE, 118/723 ME, 723 DC, 723 ER; 156/345.33, 156/345.35, 345.39, 345.4, 345.43
See application file for complete search history.

(56) References Cited

U.S. PATENT DOCUMENTS

| 6,960,307 B2 * | 11/2005 | LeClair .................... 216/52 |
| 2003/0052011 A1 | 3/2003 | Chen |
| 2004/0035838 A1 * | 2/2004 | Merard et al. ........... 219/121.43 |
| 2005/0227115 A1 * | 10/2005 | Nomura et al. .............. 428/698 |

FOREIGN PATENT DOCUMENTS

| JP | 2003-297598 A | 10/2003 |
| JP | 2004-512430 A | 4/2004 |
| JP | 2004-152523 A | 5/2004 |
| JP | 2006-274426 A | 10/2006 |
| WO | 2006/059808 A1 | 6/2006 |
| WO | 2006/107002 A1 | 10/2006 |

OTHER PUBLICATIONS

Shinfuku Nomura, et al., "Optimization of electrode design for in-liquid plasma device", The Japan Society of Mechanical Engineers Koen Ronbunshu, 2007, pp. 217-218, No. 075-1.

* cited by examiner

Primary Examiner — Maureen Gramaglia
Assistant Examiner — Tiffany Nuckols
(74) Attorney, Agent, or Firm — Sughrue Mion, PLLC

(57) ABSTRACT

In an in-liquid plasma film-forming apparatus having: a vessel 1 being capable of accommodating a substrate "S" and a liquid "L" including raw material therein; an electrode 2 for in-liquid plasma, electrode 2 which is disposed in the vessel 1; an electric power device 3 for supplying electricity to the electrode 2 for in-liquid plasma; the electrode 2 for in-liquid plasma is equipped with: a main electrode 21 having a discharging end 22; an auxiliary electrode 26 not only facing the discharging end 22 but also being disposed between the discharging end 22 and the substrate "S" that face each other; and a plasma generating unit 29 having a space that is demarcated by a surface 22a of the discharging end 22 and a surface 26a of the auxiliary electrode 26 facing the surface 22a, and being for generating plasma by means of electricity being supplied to the main electrode 21.

11 Claims, 13 Drawing Sheets

IN-LIQUID PLASMA FILM-FORMING APPARATUS, ELECTRODE FOR IN-LIQUID PLASMA, AND FILM-FORMING METHOD USING IN-LIQUID PLASMA

TECHNICAL FIELD

The present invention is one which relates to a film-forming apparatus for forming various coated films on a surface of substrate using plasma that is generated in liquid. Moreover, it is one which relates to an electrode for in-liquid plasma, electrode which can be used suitably for the present film-forming apparatus, and it is one which relates to a film-forming method using in-liquid plasma.

BACKGROUND ART

Conventionally, the vapor deposition by means of gas-phase plasma as a film-forming method using plasma has been heretofore carried out widely. However, in the gas-phase plasma, since a raw material is supplied in a state of gas, the substance density has been low, and it has been difficult to improve the film-forming rate. Hence, a film-forming method using in-liquid plasma has been attracting attention, film-forming method in which a raw material can be supplied in a state of liquid with high substance density by generating plasma in the liquid.

Regarding the in-liquid plasma, in Patent Literature No. 1 (Japanese Unexamined Patent Publication (KOKAI) Gazette No. 2003-297, 598) and Patent Literature No. 2 (Japanese Unexamined Patent Publication (KOKAI) Gazette No. 2004-152,523), bubbles are generated by using ultrasonic wave onto dodecane ($C_{12}H_{26}$) that exists in a liquid state at ordinary temperature and under ordinary pressure, and additionally electromagnetic wave is irradiated onto the position at which the bubbles are generating, thereby generating plasma with high energy within the bubbles. At this time, the dodecane exists in a state of gas inside the bubbles, and is excited by means of the plasma. And, by means of contacting the bubbles including the plasma with a substrate, carbon is deposited onto a surface of the substrate, and then an amorphous carbon film is formed at high rate.

In the aforementioned method in which in-liquid plasma is generated by irradiating electromagnetic wave onto bubbles that have generated in liquid, high reaction rate is obtainable because molecular density is extremely high in liquid phase compared with that in gas phase. However, in liquid that exhibits electric conductivity, such as water and alcohol, there is such a problem that eddy currents occur in the liquid and thereby the energy of the irradiated electromagnetic wave has been consumed. Moreover, there is such a problem as well that the electromagnetic wave has attenuated because the hydroxyl group and the like absorb specific frequencies.

Hence, in Example No. 2 of Patent Literature No. 3 (International Publication Pamphlet No. 2006/059808), plasma is generated in ethanol using an electrode for in-liquid plasma, electrode which has electrically-conducting member having a discharging end surface that contacts with the ethanol, and an insulating member covering the outer periphery of the electrically-conducting member excepting the discharging end surface. When supplying high-frequency electricity to the electrically-conducting member, the ethanol boils and then bubbles generate because the leading end of the electrically-conducting member generates heat. At the same time, plasma generates inside the bubbles because high-frequency wave is irradiated onto the position at which the bubbles generate. These bubbles are contacted with an electrically-conducting substrate (or a second electrode) that is disposed to face the discharging end surface, and thereby an amorphous carbon film is formed on a surface of the substrate.

When using the electrode for in-liquid plasma that is disclosed in Patent Literature No. 3, plasma generates readily in a broader range of liquids including liquids with electric conductivity, such as water and alcohol.

However, in order to generate plasma by supplying high-frequency electricity to an electrically-conducting member, making use of the second electrode that faces the discharging end surface of the electrically-conducting member is essential. That is, even when an electrically-conducting member is disposed alone in liquid and then high-frequency electricity is supplied to the electrically-conducting member, no plasma generates.

Moreover, in Example No. 2 of Patent Literature No. 3, by making use of a substrate having electric conductivity as the second electrode, an amorphous carbon film is formed on a surface of the substrate. Therefore, the film forming onto a surface of the substrate with electric conductivity is done with ease. However, it is not easy to carry out film forming to substrates having no electric conductivity, such as ceramic.

In addition, depending on film-forming conditions, not only glow discharge that is suitable for film forming, but also arc discharge are likely to occur between the electrically-conducting member and the substrate (or the second electrode). When arc discharge generates, it is not desirable because the substrate has deteriorated, or discharge marks have remained on the resulting film's surface. Moreover, there might arise cases where no coated film having desired property is formed due to the influence of arc discharge.

DISCLOSURE OF THE INVENTION

Hence, it is an object of the present invention to provide the following: an in-liquid plasma film-forming apparatus that makes it possible to generate plasma in liquid without using any second electrode as a substrate; an electrode for in-liquid plasma; and a film-forming method using in-liquid plasma. In addition, it is an object to provide an electrode for in-liquid plasma, electrode which makes it possible to suppress arch discharge onto substrates.

(In-Liquid Plasma Film-Forming Apparatus)

An in-liquid plasma film-forming apparatus according to the present invention is characterized in that it has:

a vessel for accommodating a substrate and a liquid including raw material therein;

an electrode for in-liquid plasma, the electrode being disposed in the vessel;

an electric power device for supplying electricity to the electrode for in-liquid plasma; and said electrode for in-liquid plasma is equipped with:

a main electrode having a discharging end that contacts with said liquid, and exhibiting electric conductivity;

an auxiliary electrode contacting with said liquid, being disposed more adjacently to a side of said discharging end than a position at which said substrate is disposed when taking a position of the discharging end as the standard, and facing the discharging end, the auxiliary electrode exhibiting electric conductivity; and a plasma generating unit having a space that is demarcated by a surface of said discharging end and a surface of said auxiliary electrode facing the surface, and being for generating plasma that comprises said raw material inside bubbles, which are formed in the space, by means of electricity being supplied to said main electrode;

wherein the bubbles including said plasma that is generated at said plasma generating unit are contacted with said substrate, thereby depositing a decomposed component of the raw material onto a surface of the substrate.

In the in-liquid plasma film-forming apparatus according to the present invention, the electrode for submerged electrode that has the auxiliary electrode in addition to the conventional main electrode is used. When electricity is supplied to the main electrode, bubbles, which include plasma that comprises the raw material included in the liquid, are generated at the plasma generating unit, which is demarcated by a surface of the discharging end and a surface of the auxiliary electrode that faces the surface of the discharging end. Consequently, the aforementioned electrode for in-liquid plasma that is equipped with the main electrode and auxiliary electrode fulfills the role of plasma generating source that can generate plasma in liquid independently. That is, it is not needed to make use of the second electrode, which faces the electrode for in-liquid plasma, as used in the conventional one.

And, the bubbles, which include plasma that is generated at the plasma generating unit, are produced one after another in the vicinity of the discharging end of the main electrode, and are then separated from the plasma generating unit by the rise of the bubbles by means of buoyant force. Since the bubbles, which include plasma, can be simply brought into contact with the substrate in order to form a coated film onto a surface of the substrate, film forming is feasible even when the substrate has any configurations and qualities of material.

Moreover, in the in-liquid plasma film-forming apparatus according to the present invention, the auxiliary electrode is disposed more adjacently to a side of the discharging end than a position at which the substrate is disposed when taking a position of the discharging end (or the main electrode) as the standard. Consequently, arc discharge is more likely to occur between the main electrode and the auxiliary electrode than between the main electrode and the substrate. As a result, arc discharge that occurs between the main electrode and the substrate is suppressed, and thereby damages to the substrate are reduced.

(Electrode for In-Liquid Plasma)

Moreover, the present invention is an electrode for in-liquid plasma that generates plasma in liquid, and can be used suitably for the aforementioned in-liquid plasma film-forming apparatus according to the present invention. An electrode for in-liquid plasma according the present invention is characterized in that it is equipped with:

a main electrode having a discharging end that contacts with said liquid, and exhibiting electric conductivity;

an insulating member covering an outer periphery of said main electrode excepting a surface of said discharging end;

an auxiliary electrode contacting with said liquid, having a cap shape that is put over said discharging end by way of said insulating member, being put in place with an interval being provided between itself and the surface of the discharging end, and exhibiting electric conductivity;

a plasma generating unit having a space that is demarcated by the surface of said discharging end and a surface of said auxiliary electrode facing the surface, and being for generating plasma inside bubbles, which are formed in the space, by means of electricity being supplied to said main electrode; and a plasma emitting unit being one or more openings that are provided in said auxiliary electrode and that are communicated with said plasma generating unit, and emitting said bubbles, which include the plasma that have been generated at said plasma generating unit, from the plasma generating unit.

The electrode for in-liquid plasma according to the present invention has the auxiliary electrode in addition to the conventional main electrode in the same manner as the electrode for in-liquid plasma in the in-liquid plasma film-forming apparatus according to the present invention. Specifically, the electrode for in-liquid plasma according to the present invention demonstrates the same effects as those of the in-liquid plasma film-forming apparatus according to the present invention that has been described already.

Further, in the electrode for in-liquid plasma according to the present invention, the auxiliary electrode has a cap shape that is put over the discharging end of the main electrode. In this instance, the main electrode, and the auxiliary electrode are put in place with an interval being provided between the surface of the discharging end and a surface of the auxiliary electrode facing the surface of the discharging end. Since it is possible to temporarily confine the bubbles within the plasma generating unit that is completed by being demarcated by both of the surfaces, intense plasma is formed inside the bubbles. Thereafter, the plasma is spouted from out of the openings, which are formed in the auxiliary electrode, along with the bubbles, and then migrates in the liquid.

(Film-Forming Method Using In-Liquid Plasma)

Moreover, it is possible to grasp the in-liquid plasma film-forming apparatus and electrode for in-liquid plasma according to the present as a film-forming method using in-liquid plasma. A film-forming method using in-liquid plasma according to the present invention is characterized in that it is a film-forming method using in-liquid plasma in which a decomposition component of raw material is deposited onto the surface of substrate via the following:

a disposing step of disposing a substrate and an electrode for in-liquid plasma in a liquid including raw material while facing them each other; and a plasma generating step of generating plasma, which comprises said raw material, inside bubbles in said liquid by supplying electricity to said electrode for in-liquid plasma;

said electrode for in-liquid plasma is equipped with:

a main electrode having a discharging end that contacts with said liquid, and exhibiting electric conductivity;

an auxiliary electrode contacting with said liquid, being disposed more adjacently to a side of said discharging end than a position at which said substrate is disposed when taking a position of the discharging end as the standard, and facing the discharging end, the auxiliary electrode exhibiting electric conductivity; and a plasma generating unit having a space that is demarcated by a surface of said discharging end and a surface of said auxiliary electrode facing the surface, and being for generating said bubbles, which include said plasma, in the space by means of electricity being supplied to said main electrode.

BEST MODE FOR CARRYING OUT THE INVENTION

Hereinafter, the best modes for carrying out the in-liquid plasma film-forming apparatus, the electrode for in-liquid plasma and the film-forming method using in-liquid plasma will be explained.

(In-Liquid Plasma Film-Forming Apparatus)

Figure 1:
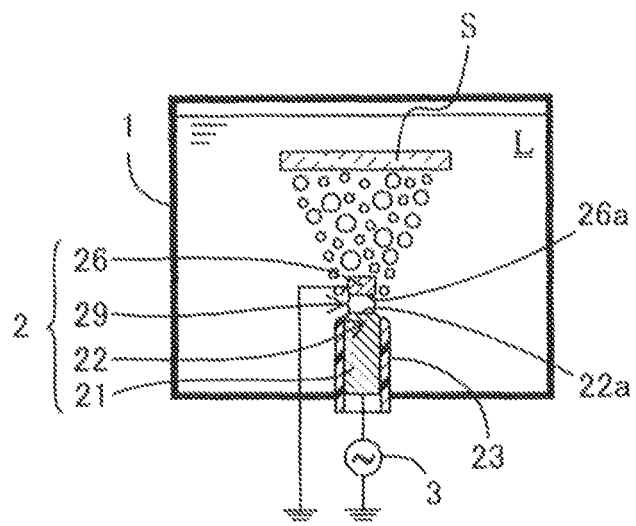
FIG. 1 is a schematic diagram for illustrating an example of an in-liquid plasma film-forming apparatus according to the present invention.

An in-liquid plasma film-forming apparatus according to the present invention (hereinafter abbreviated to as "film-forming apparatus according to the present invention") is explained using FIG. 1. Although an outline of the film-forming apparatus according to the present invention is illustrated in FIG. 1, FIG. 1 is an example of the film-forming apparatus according to the present invention, and the layout and configurations of the respective constructional elements are not limited to the modes being illustrated in FIG. 1.

The film-forming apparatus according to the present invention has a vessel 1 for holding a substrate "S" and a liquid "L" including raw material therein, an electrode 2 for in-liquid plasma that is disposed in the vessel 1, and an electric power device 3 for supplying electricity to the electrode 2 for in-liquid plasma.

As for the vessel 1, there are no limitations especially on its configuration and quality of material as far as it is a vessel that can retain the liquid "L" satisfactorily during film forming. Moreover, it is also allowable that the vessel 1 can be equipped with a fixing jig for fixing the substrate "S" at a predetermined position within the vessel 1. It is allowable that the fixing jig can not only keep the position of the substrate "S" constant but also can move the substrate "S" parallelly.

It is allowable that the liquid "L" including raw material can be selected depending on the types of objective films, because a decomposition component of the raw material coincides substantially with a component of films to be formed. For example, in a case where an amorphous carbon film is formed, it is allowable to use an organic compound that is in liquid form at ordinary temperature and under ordinary pressure. As for the organic compound, the following can be given: hydrocarbon, such as dodecane; ether, such as ethyl ether and tetrahydrofuran; alcohol, such as methanol and ethanol; phenol (including compounds other than phenolic acid ($C_6H_5OH$) in which one or more hydroxyl groups substitute for one or more hydrogen atoms in the aromatic hydrocarbon nucleus); and the like. It is allowable not only to use these organic compounds independently but also to mix two or more of them to use. Moreover, in a case where a silicone oxide film is formed, it is allowable to use an organic compound including silicon. To be concrete, a silicon compound, such as silicone oils, can be given. Note that, even when being an organic compound that is not in liquid form at ordinary temperature and under ordinary pressure, it is feasible to make use of it as the raw material when it is soluble in water, alcohol, ether, and so forth.

There are no limitations on the configuration and material quality of the substrate "S." As for the material quality of the substrate, it is not limited to metallic materials that exhibit electric conductivity; and accordingly it is feasible to form films onto substrates that comprise metallic materials, inorganic materials or organic materials; to be concrete, it is feasible to form films onto almost all substrates, such as inorganic glass, organic glass, rubber, resin, fiber, ceramic, wood and paper.

The electrode 2 for in-liquid plasma is equipped with a main electrode 21 and an auxiliary electrode 26, and a plasma generating unit 29 that is positioned between both electrodes.

The main electrode 21 exhibits electric conductivity, and has a discharging end 22 that contacts with the liquid "L."

As far as the main electrode 21 is an electrically conductive material, there are no limitations especially on its quality of material. For example, when being a metallic material, in addition to copper (Cu) or copper alloys including Cu, aluminum (Al) or aluminum alloys including Al and stainless, it is possible to use tungsten (W), silver (Ag), molybdenum (Mo), gold (Au), platinum (Pt) and the like, and various alloys including them. Moreover, it is also allowable that it can be a main electrode that comprises carbon.

Although there are no limitations on the configuration of the main electrode 21, it is allowable that at least the discharging end 22 can have a rod-shaped configuration, such as being cylindrical columnar or square columnar, or a plate-shaped configuration. Specifically, it is preferable that the cross-sectional configuration of the discharging end 22 can be a circle or rectangle, such as perfect circles, elliptical shapes, squares or rectangles. Moreover, the leading end of the discharging end 22 can also be a curved surface or a hemisphere surface, in addition to a flat surface; moreover, it can even be a sharp-pointed configuration.

It is allowable that the main electrode 21 can be equipped with an insulating member 23 that covers the outer periphery of the main electrode 21 excepting the surface of the discharging end 22 (hereinafter being set forth as a "discharging surface 22a"). The insulating member 23 is not limited on its configuration in particular as far as it can cover the outer periphery of the main electrode 21 excepting the discharging surface 22a, and accordingly it is allowable to select it appropriately depending on the configuration of the main electrode 21. Note that, although the end of the main electrode 21 protrudes from the insulating member 23 in FIG. 1, it is also allowable that the end of the main electrode 21 can be depressed into the insulating member 23. In the case where the end of the main electrode 21 protrudes from the insulating member 23, the protruding end becomes the discharging end 22. In the case where the end of the main electrode 21 is depressed into the insulating member 23, because at least a part of the end surface becomes the discharging surface 22a, an extremely small (or thin) part that has that end surface is regarded as the discharging end 22.

Note that there are no limitations on the protruding magnitude of the discharging end 22 from the insulating member 23 (or depression magnitude). Preferably, when taking an end surface of the insulating member 23 that is substantially parallel to an end surface of the discharging end 22 as the datum surface, a distance "X" (unit: mm) from that datum surface to a plane involving the end surface can be $-1 \leq$"X"$\leq 1$.

The insulating member 23 can preferably be made from resin or ceramic. As for the resin, the following can be given: epoxy resin, phenol resin, unsaturated polyester resin, urea resin, melamine resin, polyurethane resin, silicone resin, cyanate resin, polyamide resin, polyacetal, polycarbonate, denatured polyphenylene ether, thermoplastic polyester resin, polytetrafluoroethylene, fluorocarbon resin, polyphenylene sulfide, polysulfone, amorphous polyallylate, polyetherimide, polyethersulphone, polyetherketone, liquid-crystal polyester, polyamideimide, polyamide, poly(allyl ether nitrile), polybenzoimidazole, and polymer alloys of these, and the like; as for the ceramic, the following can be given: alumina, alumina-silica, zirconia, silicon nitride-alumina (sialon), mica (flurorinated phlogopite), Wollastonite, hexagonal boron nitride, aluminum nitride, cordierite, petalite, and so forth.

The auxiliary electrode 26 exhibits electric conductivity, and is disposed more adjacently to a side of the discharging end 22 than a position at which the substrate "S" is disposed when taking a position of the discharging end 22 of the main electrode 21 as the standard. On this occasion, the auxiliary electrode 26 faces the discharging end 22. And, the auxiliary electrode 26 contacts with the liquid "L."

As far as the auxiliary electrode 26 is an electrically conductive material, there are no limitations especially on its quality of material. For example, when being a metallic material, in addition to copper (Cu) or copper alloys including Cu, aluminum (Al) or aluminum alloys including Al and stainless, it is possible to use tungsten (W), silver (Ag), molybdenum (Mo), gold (Au), platinum (Pt) and the like, and various alloys including them. Moreover, it is also allowable that it can be an electrode that comprises carbon.

The auxiliary electrode 26 is disposed more adjacently to a side of the discharging end 22 than a position at which the substrate "S" is disposed when taking a position of the discharge end 22 of the main electrode 21 as the standard. An example of the layout of the main electrode 21, auxiliary electrode 26 and substrate "S" is illustrated in FIG. 1. In FIG. 1, the discharging end 22 of the main electrode 21 is disposed to face the substrate "S," and the auxiliary electrode 26 is disposed between the substrate "S" and the main electrode 21. Moreover, in FIG. 1, although the main electrode 21, the auxiliary electrode 26 and the substrate "S" are disposed while lining them up in this order in the vertical direction, it is allowable to lay out the electrode 2 for in-liquid plasma while inclining it within the range of ±90° in FIG. 1. Specifically, it is also allowable to line up the main electrode 21 and auxiliary electrode 26 horizontally virtually on the vertically lower side of the substrate "S." Moreover, depending on the distance between the electrode 2 for in-liquid plasma and the substrate "S," it is also feasible to use the electrode 2 for in-liquid plasma while disposing it above the substrate "S."

There are no limitations on the configuration of the auxiliary electrode 26, it is allowable that it can have such a configuration that faces at least a part of the surface of the discharging end 22 of the main electrode 21. For example, it is possible to give the following: a plate-shaped body that has substantially the same configuration as a cross-sectional configuration of the discharging end 22, a rod-shaped body or sharp-pointed needle-shaped body that is provided with a leading end that faces at least a part of the surface of the discharging end 22, a cap that covers the entire surface of the discharging end 22, and the like. Moreover, it is allowable that the auxiliary electrode 26 can have one or more openings that communicate with the plasma generating unit 29 being explained subsequently. Accordingly, it is even allowable that the auxiliary electrode 26 can be formed of a plate-shaped body that has a plurality of through holes that penetrate in the thickness-wise direction. As specific examples, although punching metals, expanded metals, and so forth, can be given, metallic nets are included in the aforementioned plate-shaped body. Note that a cap-configured auxiliary electrode will be detailed in the section of (Electrode for In-liquid Plasma).

When using a rod-shaped body as the auxiliary electrode, arc discharge between a substrate, which is placed around the rod-shaped body, and the rod-shaped body is suppressed and thereby damages to the substrate are reduced, because arc discharge becomes likely to occur between a discharging end surface and the leading end of the rod-shaped body. Accordingly, it is suitable for film forming that is carried out while putting a ring-shaped flat plate serving as the substrate and a rod-shaped body serving as the auxiliary electrode in place coaxially. For example, as for the ring-shaped flat plate, clutches, washers, bearings, and the like, can be given. There are no limitations on the configuration and dimensions of the rod-shaped body in particular. When a cross-sectional configuration of the rod-shaped body is a circular shape, it is allowable that the diameter can be φ0.0001 mm-100 mm. It is allowable that the leading end of the rod-shaped body can have any one of flat surfaces, spherical surfaces, sharp-pointed ones, and so forth, at the end surface.

Moreover, when using a plate-shaped body having a plurality of through holes as the auxiliary electrode, it is possible to cover the substrate's surface to be subjected to film forming entirely, the bubbles being generated from the discharging end surface pass through the through holes and then migrate readily to the surface to be subjected to film forming. Accordingly, even when the surface to be subjected to film forming is covered with the auxiliary electrode, it is possible to suppress arc discharge over a wide range without ever deteriorating the efficiency of film forming. Although there are no limitations on the configuration and dimensions of the through holes especially, in a case where a metallic net is used, and when the number of meshes that are included per one inch is 1-1,000 mesh/in, it not only suppresses arc discharge but also makes the bubbles more likely to migrate.

The plasma generating unit 29 has a space that is demarcated by a surface of the discharging end 22 (i.e., a discharging surface 22a) and a surface 26a of the auxiliary electrode 26 that faces the discharging surface 22a. In the plasma generating unit 29, plasma is generated inside bubbles, which are formed between the facing surfaces, namely, between the discharging surface 22a and the surface 26a of the auxiliary 26 (i.e., in the space), by means of electricity being supplied to the main electrode 21.

The bubbles in the plasma generating unit 29 are generated because the main electrode 21 generates heat to heat and then boil the liquid "L" by means of electricity being supplied to the electrode 2 for in-liquid plasma. In a case where one would like to generate the bubbles furthermore in the plasma generating unit 29, it is also allowable to generate the bubbles by means of the following methods: the plasma generating unit 29 is provided with a heat generator to heat the liquid "L"; applying ultrasonic wave to the liquid "L" in the plasma generating unit 29; supplying a gas that depends on the type of the liquid "L," and the like.

And, the inside of the bubbles are in such a state that a raw material being included in the liquid "L" is present in gaseous state at high temperature and under high pressure and accordingly plasma comprising the raw material is likely to generate. Consequently, plasma is generated readily inside the bubbles by means of gaseous discharge at the plasma generating unit 29. When the electric power device 3 is a high-frequency electric power source that supplies high-frequency electricity, the bubbles including plasma are formed readily by irradiating the plasma generating unit 29 with high-frequency wave. It is allowable that the frequency being utilized can be selected appropriately in conformity with the type of the liquid "L," and it is allowable to utilize it in the range of 3 MHz-3 GHz. In particular, in a case where an aqueous solution is utilized as the liquid "L" when utilizing 13.56 MHz or 27.12 MHz that has been permitted industrially, it is less likely to be susceptible to the absorption by means of the liquid "L." Similar effects are obtainable not only with sine waves but also with pulsating electric power sources.

On this occasion, it is preferable that the plasma generating unit 29 can have a vapor-phase space that is formed by means of the bubbles which connect continuously between the facing surfaces (i.e., in the space), namely, between the discharging surface 22a and the auxiliary electrode 26's surface 26a facing the discharging surface 22a. Because of the vapor-phase space being formed between the facing surfaces, intense plasma generates inside the bubbles. Moreover, since arc discharge becomes likely to occur within the plasma generating unit 29, damages to the substrate by means of arc discharge are reduced. To be concrete, it is preferable that the main electrode 21 and auxiliary electrode 26 can be disposed so that a distance between their facing surfaces (or a distance "D" between the main and auxiliary electrodes) falls within the range of 0.001-100 mm, further 0.1 mm-30 mm. When the distance "D" between the main and auxiliary electrodes is less than 0.001 mm, the insulating property between the main electrode 21 and the auxiliary electrode 26 becomes low, and accordingly the generation of plasma at the plasma generating unit 29 becomes difficult. When the distance "D" between the main and auxiliary electrodes surpasses 100 mm, it becomes difficult to connect continuously between the facing surfaces by bubbles with ordinary size, and consequently plasma, which generates inside the bubbles, tends to weaken. Note that, in a case where the discharging surface 22a of the main electrode 21 and the surface 26a of the auxiliary electrode 26 face in the substantially horizontal direction, it is allowable to set the distance "D" between the main and auxiliary electrodes to 20 mm or less.

Note that the occurrence likelihood of arc plasma is affected not only by the distance between the facing surfaces of the main electrode 21 and auxiliary electrode 26 (or the distance "D" between the main and auxiliary electrodes) or a distance between facing surfaces of the main electrode 21 and the substrate "S" (or a distance "d" between the main electrode and substrate), but also by the pressure and electric conductivity within the bubbles, in addition to the quality of material of the substrate "S." Accordingly, it is allowable that the main electrode 21, the auxiliary electrode 26, and the substrate "S" can be put in place, respectively, so that a discharge distance at which arch discharge occurs between the surface of the discharging end 22 of the main electrode (i.e., the discharging surface 22a) and the surface 26a of the auxiliary electrode 26 facing the discharging surface 22a becomes shorter than a discharge distance at which arc discharge occurs between the discharging surface 22a and a surface of the substrate "S" (in particular, a surface of the substrate "S" facing the discharging surface 22a). On this occasion, it is allowable that the distance "D" between the main and auxiliary electrodes can be smaller sufficiently than the distance "d" between the main electrode and substrate. Note that it is possible to do film forming efficiently by setting the distance "d" between the main electrode and substrate to 0.001-200 mm.

At the plasma generating unit 29, the bubbles including plasma are generated one after another, and the generated bubbles are separated off from the plasma generating unit 29 by means of buoyant force to migrate within the vessel 1. In this instance, it is allowable that the electrode 2 for in-liquid plasma can be further equipped with a plasma emitting unit for emitting the bubbles, which include the plasma that has been generated at the plasma generating unit 29, from the plasma generating unit 29. It is preferable that the plasma emitting unit can be one or more openings, which are provided in the auxiliary electrode 26 and which communicate with the plasma generating unit 29. The bubbles, which include the plasma that has been generated at the plasma generating unit 29, are emitted to the vessel 1 through the openings. Accordingly, it is allowable that the auxiliary electrode 26 can be formed of a plate material, which has a plurality of openings that penetrate in the thickness-wise direction, a metallic net, or the like, as described above.

The plasma that has generated inside the bubbles migrate together with the bubbles, and then contact with a surface of the substrate that is placed in the liquid. Thus, the decomposed component of the raw material that has been activated to plasma state is deposited onto the surface of the substrate, and thereby a coated film is formed on the surface of the substrate. Note that the principle of activating the raw material inside the bubbles and then depositing it onto the surface of the substrate is the same as that of conventional CVD method.

It is allowable that the film-forming apparatus according to the present invention can further have an exhausting means for depressurizing the space that includes the vessel 1. By means of doing depressurizing, the generation of plasma becomes easy. It is desirable that the pressure on this occasion can be 1-600 hPa. Note that, since the depressurizing is effective especially at the start of the generation of the bubbles and plasma, it does not matter to return the depressurization back to ordinary pressure when the generation of the bubbles and plasma becomes stable; however, it is even allowable that the exhausting means can have a control function for adjusting the pressure that is needed to maintain the plasma. In addition to the exhausting means, it is also allowable to have a liquid circulating device for circulating the liquid "L" within the vessel 1, and the like, while aiming at making a raw-material concentration of the liquid "L" uniform or making the bubbles including the plasma likely to contact with the surface of the substrate.

Hereinafter, an electrode for in-liquid plasma will be explained, electrode which has an especially desirable mode for the film-forming apparatus according to the present invention.

(Electrode for In-Liquid Plasma)

Figure 2:
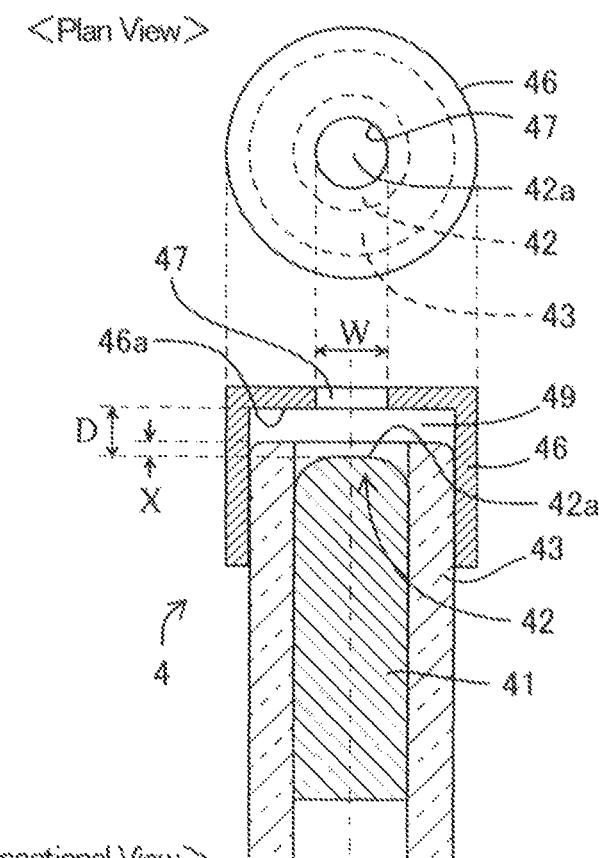
FIG. 2 is a schematic diagram for illustrating an example of an electrode for in-liquid plasma according to the present invention, that is, the plan view (upper diagram) being viewed from the auxiliary-electrode side and the axially cross-sectional view (lower diagram).

An electrode for in-liquid plasma according to the present invention will be explained using FIG. 2. Although FIG. 2 shows the plan view (upper diagram) of the electrode for in-liquid plasma according to the present invention, and the axially cross-sectional view (lower diagram), FIG. 2 is an example of the electrode for in-liquid plasma according to the present invention, the layout and configuration of the respective constituent elements are not limited to the modes that are illustrated in FIG. 2.

An electrode 4 for in-liquid plasma according to the present invention is an electrode for generating plasma in liquid, and is equipped with a main electrode 41, an insulating member 43, an auxiliary electrode 46, a plasma generating unit 49 and a plasma emitting unit 47.

The main electrode 41 exhibits electric conductivity, and has a discharging end 42 that contacts with a liquid. The configurations and material qualities of the main electrode 41 and discharging end 42 are just as having being described already.

The insulating member 43 covers the outer periphery of the main electrode 41 excepting the surface of the discharging end 42. The configuration and material quality of the insulating member 43 are also just as having being described already. Note that, although the end of the main electrode 41 is depressed down into the insulating member 43 ("X"<0) in FIG. 2, it is allowable that the end of the main electrode 41 can protrude from the insulating member 43.

The auxiliary electrode 46 exhibits electric conductivity, and has a cap shape that is put over the discharging end 42 of the main electrode 41 by way of the insulating member 43. Accordingly, the auxiliary electrode 46 covers a surface of the discharging end 42 (or a discharging surface 42a). On this occasion, the auxiliary electrode 46 is put in place with an interval being provided between itself and the discharging surface 42a. And, the auxiliary electrode 46 contacts with the liquid.

The material quality of the auxiliary electrode 46 is just as having been described already. The configuration of the auxiliary electrode 46 is not limited especially as far as being a cap shape that can be put over the discharging end 42 of the main electrode 41 by way of the insulating member 43, it is allowable to select it suitably in conformity with the configuration of the discharging end 42. For example, when the main electrode 41 (or the discharging end 42) has a cylindrical solid configuration as shown in FIG. 2, it is desirable that the auxiliary electrode 46 can have a bottomed cylindrical hollow configuration.

The plasma generating unit 49 is demarcated at least by the surface of the discharging end 42 (or the discharging surface 42a) and a surface 46a of the auxiliary electrode that faces the discharging surface 42a. And, as having been described already, plasma is generated inside bubbles, which are formed between the facing surfaces (or space) by which the plasma generating unit 49 is demarcated by means of electricity being supplied to the main electrode 41.

The plasma emitting unit 47, with which the auxiliary electrode 46 is provided, is one or more openings that communicate with the plasma generating unit 49. Through the opening 47, bubbles are emitted, bubbles which include plasma that has been generated at the plasma generating unit 49. In a case where the electrode 4 for in-liquid plasma is applied to the in-liquid plasma film-forming apparatus according to the present invention, it is allowable to dispose the electrode for in-liquid plasma so that the opening 47 faces the surface of substrate. Note that, although the opening 47 is provided in a quantity of one with respect to one auxiliary electrode, it is allowable to provide one auxiliary electrode with it in a quantity of plural pieces; there are not any limitations on the size and configuration, either. Consequently, it is also allowable to process a punching metal or expanded metal to form the auxiliary electrode 46.

In particular, as illustrated in FIG. 2, in a case where the discharging end 42 of the main electrode 41 has a cylindrical solid configuration and the auxiliary electrode 46 has a bottomed cylindrical hollow configuration that has the opening 47 in the bottom surface, it is preferable that the opening 47 has a diameter "W" of from 1 mm or more to less than 2 mm. Although the bubbles including plasma are less likely to be emitted from the plasma generating unit 49 when the diameter "W" of the opening 47 is small, the bubbles are emitted favorably when "W" is 1 mm or more, and accordingly film forming becomes feasible at practical rate. Moreover, the larger the diameter "W" becomes, the larger the discharge distance at which arc discharge occurs between the main electrode 41 and the auxiliary electrode 46 becomes larger virtually, and consequently arc discharge becomes likely to occur between the main electrode 41 and a substrate. Although the upper limit of the diameter "W" cannot be prescribed in general because it depends on the position of the substrate "S" in the in-liquid plasma film-forming apparatus as well, it is desirable to set the diameter "W" of the opening 47 to less than 2 mm, further to 1.9 mm or less or 1.7 mm or less.

Moreover, it is desirable that the shortest distance between the facing surface of the main electrode 41 and the facing surface of the auxiliary electrode 46 (or the distance "D" between the main and auxiliary electrodes) can be 0.001 mm-100 mm, further 0.1-30 mm, as described above.

(Film-Forming Method Using In-Liquid Plasma)

In a film-forming method using in-liquid plasma according to the present invention, a decomposition component of raw material is deposited onto the surface of substrate via the following: a disposing step of disposing a substrate and an electrode for in-liquid plasma in a liquid including raw material while facing them each other; and a plasma generating step of generating plasma, which comprises the raw material, inside bubbles in the liquid by supplying electricity to the aforementioned electrode for in-liquid plasma.

The electrode for in-liquid plasma being used in the film-forming method according to the present invention is just as having been described already. Specifically, it is equipped not only with the main electrode and auxiliary electrode, but also with the plasma generating unit having a space that is demarcated by a surface of the discharging end of the main electrode and a surface of the auxiliary electrode facing the surface. The plasma generating unit generates said bubbles, which include plasma, in the space by means of electricity being supplied to the main electrode.

So far, the embodiment modes of the in-liquid plasma film-forming apparatus, electrode for in-liquid plasma and film-forming method using in-liquid plasma according to the present invention have been explained, however, the present invention is not one which is limited to the aforementioned embodiment modes. It can be conducted in various modes to which modifications, improvements, and the like, which one of ordinary skill in the art can carry out, are performed, within a range not departing from the scope of the present invention.

Hereinafter, the present invention will be explained concretely while giving examples of the embodiment modes of the in-liquid plasma film-forming apparatus, electrode for in-liquid plasma and film-forming method using in-liquid plasma according to the present invention. An in-liquid plasma film-forming apparatus according to a specific example will be explained using FIG. 2 and FIG. 3.

(Electrode for In-Liquid Plasma)

An electrode 4 for in-liquid plasma (FIG. 2) has a main electrode 41, and an auxiliary electrode 46. The main electrode 41 is a tungsten round bar with 3 mmϕ in diameter, and the leading end of its discharging end 42 has a semi sphere shape with 1.5 mm in curvature radius. Onto the main electrode 41, a quarts tube with 1.5 mm in thickness (i.e., an insulating member 43), quarts tube which covers its outer peripheral surface, is fitted outward around it. On this occasion, when taking an opposite end surface of the insulating member 43 that is substantially parallel to the top face of the discharging end 42, that is, an opposite end surface of the main electrode 41, as a datum plane, it is possible to adjust a distance (i.e., the protruding magnitude "X") from the datum plane up to a plane involving the end surface (i.e., the top surface) by moving the main electrode 41 and the insulating member 43 relatively to each other in the axial direction.

The auxiliary electrode 46 is made of pure aluminum, and has a bottomed cylindrical hollow configuration with 0.3 mm in thickness, 16 mm ø in outside diameter and 7 mm in height. The auxiliary electrode 46 has a circular opening 47 with "W" in diameter in the central section of the bottom surface. The auxiliary electrode 46 is fitted outward around an opposite end of the insulating member 43, and is put over the discharging end 42 of the main electrode 41. On this occasion, it is possible to adjust an interval (i.e., the distance "D" between the main and auxiliary electrodes) between a vertically facing surface of the main electrode 41 and a vertically facing surface of the auxiliary electrode 46 (i.e., between a plane, which involves the opposite end surface of the main electrode 41, and another plane, which involves the inner bottom surface 46a of the auxiliary electrode 46) by moving the main electrode 41 and the auxiliary electrode 46 relatively to each other in the axial direction.

In this way, a plasma generating unit 49 is demarcated between the main electrode 41 and the auxiliary electrode 46. The plasma generating unit 49 communicates with the opening 47 (i.e., the plasma emitting unit) that is positioned coaxially with the main electrode 41. Note that, regarding the auxiliary electrode 46, four types of electrodes 4 for in-liquid plasma were made ready, electrodes 4 in which the opening diameter "W" of the opening 47 differed as follows: 1.0 mmϕ; 1.5 mmϕ; 1.7 mmϕ; and 2.0 mmϕ.

(In-Liquid Plasma Film-Forming Apparatus I)

Figure 3:
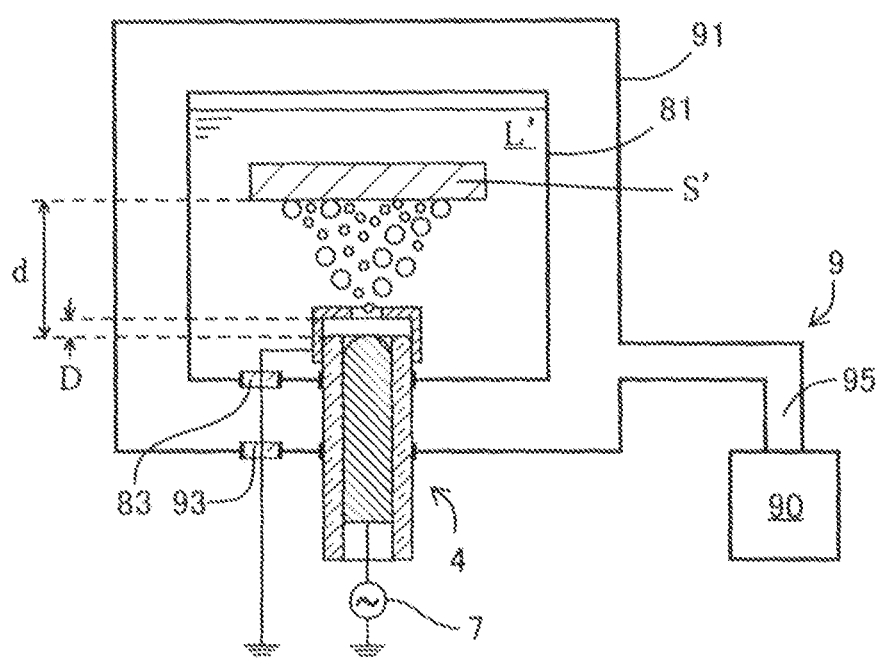
FIG. 3 is an explanatory diagram of an in-liquid plasma film-forming apparatus that was used for the film forming of amorphous carbon film (later-described Film Forming Nos. 1-5).

FIG. 3 is an explanatory diagram of an in-liquid plasma film-forming apparatus. The in-liquid plasma film-forming apparatus has vessels 81 and 91, the electrode 4 for in-liquid plasma, and an electric power device 7.

The vessel 81 comprises a vessel body that is made of quartz glass and has a cylindrical hollow configuration, and closing members that close its lower opening end and upper opening end, and which are made of stainless and have a substantially circular disk shape. To the closing member that closes the lower opening end, the electrode 4 for in-liquid plasma is fixed in its central section. The electrode 4 for in-liquid plasma is disposed so that the discharging end 42 and auxiliary electrode 46 protrude into the inside of the vessel 81.

Inside the vessel 81, a liquid "L'" is filled, and the discharging end 42 and auxiliary electrode 46 contact with the liquid "L'" Above the electrode 4 for in-liquid plasma, a substrate "S'" is retained by means of a not-shown retaining jig that the substrate "S'" faces the electrode 4 with a predetermined distance "d" between the electrode and substrate that is provided between them. Note that the distance "d" between the electrode and substrate is the shortest distance from the end surface of the main electrode 41 (or the top surface) to a surface of the substrate "S'" (or the surface to be subjected to film forming). The substrate "S'" is retained in such a state that at least the surface of the substrate "S'," which is to be subjected to film forming, is immersed into the liquid "L'."

Of the wirings of the electrode 4 for in-liquid plasma, that of the main electrode 41 is wire connected to the high-frequency electric power source 7, and that of the auxiliary electrode 46 is led out to the outside of the vessels 81 and 91 by way of insulators 83 and 93 and is then grounded.

The vessel 81 is accommodated inside the outer vessel 91 with dimensions that are larger by one size than those of the vessel 81. Other than having a vacuum pump 90 that is connected with the outer vessel 91 by way of an exhaust passage 95, the outer vessel 91 has the same constructions as those of the vessel 81.

(Plasma Generation in Methanol)

Using the aforementioned in-liquid plasma film-forming apparatus, plasma was generated in methanol. Methanol was made ready as the liquid "L'," and the vessel 81 of the in-liquid plasma film-forming apparatus was filled with it. Moreover, the electrode 4 for in-liquid plasma was set so that the protruding magnitude "X"=0 mm (namely, the top surface and the datum plane were present in an identical plane: see FIG. 3); and so that the opening diameter "W"=2.0 mm and the distance "D" between the electrodes=1.0 mm. No substrate "S'" was disposed.

To begin with, the inside of the outer vessel 91 was depressurized to set the inside-vessel pressure at 300 hPa. Next, the frequency of the output electricity from the high-frequency electric power source 7 was set at 27.12 MHz, and the output was set at 100 W (reflection: 0 W), and then the high-frequency electricity was supplied to the electrode 4 for in-liquid plasma.

Upon observing the inside of the vessel 81, bubbles in the inside of which plasma generated were spouted out continuously from the opening 47 of the auxiliary electrode 46, and then migrated upward through the liquid "L'." That is, it becomes feasible to do film forming even onto a surface of substrate that does not exhibit electric conductivity by putting a substrate in place above the opening 47.

(Film Forming of Amorphous Carbon Film)

Using the four types of the electrodes 4 for in-liquid plasma, electrodes 4 whose opening diameters "W" were different from each other, amorphous carbon films were formed on a substrate's surface.

(Film-Forming No. 1)

Methanol was made ready as the liquid "L'," and the vessel 81 of the in-liquid plasma film-forming apparatus was filled with it. Moreover, the electrode 4 for in-liquid plasma was set so that the protruding magnitude "X"=0 mm; and the opening diameter "W"=1.0 mm. For the substrate "S'," a silicon wafer was used.

To begin with, the inside of the outer vessel 91 was depressurized to set the inside-vessel pressure at 300 hPa. Next, the frequency of the output electricity from the high-frequency electric power source 7 was set at 27.12 MHz, and the output was set at 100 W (reflection: 0 W), and then the high-frequency electricity was supplied to the electrode 4 for in-liquid plasma for 1 minute, thereby carrying out film forming. Bubbles in the inside of which plasma generated were spouted out continuously from the opening 47 of the auxiliary electrode 46, and then migrated upward through the liquid "L'" toward a surface of the substrate "S'."

Upon taking the substrate "S'" from out of the vessel 81 after turning off the supply of the high-frequency electricity, it was possible to confirm that a black-colored coated film was formed on the surface of the substrate "S'." Note that the sample being obtained in Film-forming No. 1 is labeled #11.

(Film-Forming No. 2)

Except that the opening diameter of the electrode 4 for in-liquid plasma was set at "W"=1.5 mm, an amorphous carbon film was formed on a surface of the substrate "S'" in the same manner as Film-forming No. 1. Note that the sample being obtained in Film-forming No. 2 is labeled #12.

(Film-Forming No. 3)

Except that the opening diameter of the electrode 4 for in-liquid plasma was set at "W"=1.7 mm, an amorphous carbon film was formed on a surface of the substrate "S'" in the same manner as Film-forming No. 1. Note that the sample being obtained in Film-forming No. 3 is labeled #13.

(Film-Forming No. 4)

Except that the opening diameter of the electrode 4 for in-liquid plasma was set at "W"=2.0 mm and the film-forming time was set at 3 minutes, an amorphous carbon film was formed on a surface of the substrate "S'" in the same manner as Film-forming No. 1. Note that the sample being obtained in Film-forming No. 4 is labeled #14.

(Film-Forming No. 5 (Comparative Example))

Except that the auxiliary electrode 46 was removed from the electrode 4 for in-liquid plasma and the film-forming time was set at 3 minutes, an amorphous carbon film was formed on a surface of the substrate "S'" in the same manner as Film-forming No. 1. Note that the sample being obtained in Film-forming No. 5 is labeled #C1.

Bubbles in the inside of which plasma generated were generated from the discharging end 42 of the main electrode 41, and then migrated upward through the liquid "L'" toward a surface of the substrate "S'." On this occasion, arc discharge occurred frequently between the main electrode 41 and the substrate "S'."

(In-Liquid Plasma Film-Forming Apparatus II)

Figure 9:
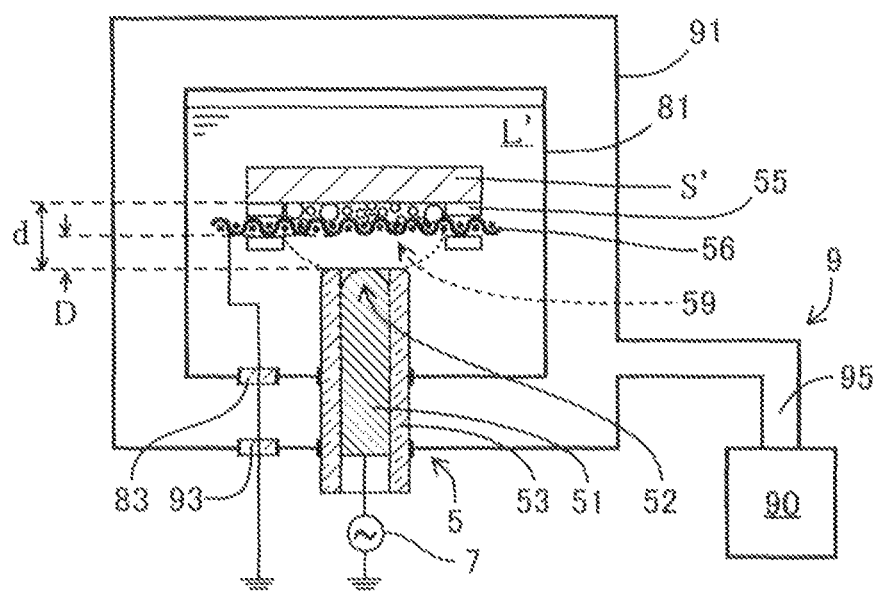
FIG. 9 is an explanatory diagram of an in-liquid plasma film-forming apparatus that was used for the film forming of amorphous carbon film (later-described Film Forming No. 6 and Film Forming No. 7).

Except that the in-liquid plasma film-forming apparatus being illustrated in FIG. 9 has an electrode 5 for in-liquid plasma that uses a metallic net as an auxiliary electrode, it is the same as the in-liquid plasma film-forming apparatus that has been explained already. A main electrode 51, a discharging end 52, and an insulating member 53 are the same as the aforementioned main electrode 41, discharging end 42, and insulating member 43 (FIG. 2). A metallic net 56, an auxiliary electrode, is fixed parallelly with respect to a surface of a substrate "S'," which is to be subjected to film forming, by way of an insulative spacer 55 that is placed on the peripheral section of the surface that is to be subjected to film forming.

The electrode 5 for in-liquid plasma is disposed so that the discharging end 52 of the main electrode 51 protrudes into the inside of the vessel 81. Inside the vessel 81, a liquid "L'" is filled, and the discharging end 52 and metallic net 56 contact with the liquid "L'." Above the discharging end 52, a substrate "S'" with the metallic net 56 being fixed is retained by means of a not-shown retaining jig so as to be as follows: (the distance "d" between the electrode and substrate)>(the distance "D" between the electrodes). On this occasion, the substrate "S'" is retained in such a state that at least the surface, which is to be subjected to film forming, is immersed into the liquid "L'." In this way, the metallic net 56, an auxiliary electrode, is put in place between the main electrode 51 and the substrate "S'."

Of the wirings of the electrode 5 for in-liquid plasma, that of the main electrode 51 is wire connected to a high-frequency electric power source 7, and that of the metallic net 56 is led out to the outside of the vessels 81 and 91 by way of insulators 83 and 93 and is then grounded.

(Film Forming of Amorphous Carbon Film)

Using the in-liquid plasma film-forming apparatus II, amorphous carbon films were formed on a substrate's surface.

(Film-Forming No. 6)

Methanol was made ready as the liquid "L'," and the vessel 81 of the in-liquid plasma film-forming apparatus II was filled with it. Moreover, the electrode 5 for in-liquid plasma was made ready by making a tungsten metallic net ready, tungsten metallic net whose wire diameter was φ90.1 mm (the number of meshes that were included per one inch: 20 mesh/in) and which served as the metallic net 56. For the substrate "S'," a silicon wafer was used.

To begin with, the inside of the outer vessel 91 was depressurized to set the inside-vessel pressure at 300 hPa. Next, the frequency of the output electricity from the high-frequency electric power source 7 was set at 27.12 MHz, and the output was set at 100 W (reflection: 20 W), and then the high-frequency electricity was supplied to the electrode 5 for in-liquid plasma for 50 seconds, thereby carrying out film forming. Bubbles in the inside of which plasma generated arose between the main electrode 51 and the metallic net 56 (i.e., a plasma generating unit 59); and the bubbles spouted out continuously from the meshes of the metallic net 56, and then migrated toward a surface of the substrate "S'."

Upon taking the substrate "S'" from out of the vessel 81 after turning off the supply of the high-frequency electricity, it was possible to confirm that a black-colored coated film was formed on the surface of the substrate "S'." Note that the sample being obtained in Film-forming No. 6 is labeled #21.

(Film-Forming No. 7 (Comparative Example))

Except that the metallic net 56 was removed, an amorphous carbon film was formed on a surface of the substrate "S'" in the same manner as Film-forming No. 6. Note that the sample being obtained in Film-forming No. 7 is labeled #C2.

Bubbles in the inside of which plasma generated was generated from the discharging end 52 of the main electrode 51, and then migrated upward through the liquid "L'" toward a surface of the substrate "S'." On this occasion, arc discharge occurred frequently between the main electrode 51 and the substrate "S'."

(In-Liquid Plasma Film-Forming Apparatus III)

Figure 12:
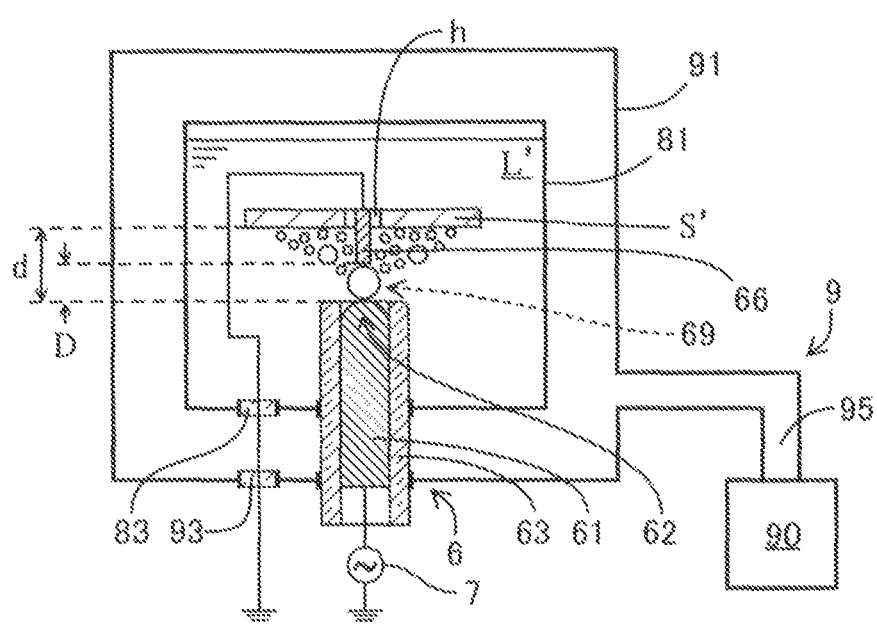
FIG. 12 is an explanatory diagram of an in-liquid plasma film-forming apparatus that was used for the film forming of amorphous carbon film (later-described Film Forming No. 8 and Film Forming No. 9).

Except that the in-liquid plasma film-forming apparatus being illustrated in FIG. 12 has an electrode 6 for in-liquid plasma that uses a rod-shaped body as an auxiliary electrode, it is the same as the in-liquid plasma film-forming apparatus that has been explained already. A main electrode 61, a discharging end 62, and an insulating member 63 are the same as the aforementioned main electrode 41, discharging end 42, and insulating member 43 (FIG. 2).

The electrode 6 for in-liquid plasma is disposed so that the discharging end 62 of the main electrode 61 protrudes into the inside of the vessel 81. Inside the vessel 81, a liquid "L'" is filled, and the discharging end 62 and rod-shaped body 66 contact with the liquid "L'." Above the discharging end 62, a substrate "S'" with a through hole "h" being formed at the central section is retained by means of a not-shown retaining jig. The rod-shaped body 66 is inserted into the through hole "h," and an opposite end of the rod-shaped body 66 protrudes toward the side of a surface that is to be subjected to film forming. The main electrode 61, the rod-shaped body 66, and the through hole "h" are put in place coaxially, respectively. Moreover, the substrate "S'" is retained in such a state that at least the surface, which is to be subjected to film forming, is immersed into the liquid "L'." In this way, the rod shaped body 66, an auxiliary electrode, is put in place between the main electrode 51 and the substrate "S" so as to be as follows: (the distance "d" between the electrode and substrate)>(the distance "D" between the electrodes).

Of the wirings of the electrode 6 for in-liquid plasma, that of the main electrode 61 is wire connected to the high-frequency electric power source 7, and that of the rod-shaped body 66 is led out to the outside of the vessels 81 and 91 by way of insulators 83 and 93 and is then grounded.

plasma generating unit 69), and then the bubbles migrated toward a surface of the substrate "S" from the peripheral part of the plasma generating unit 69.

Upon taking the substrate "S" from out of the vessel 81 after turning off the supply of the high-frequency electricity, it was possible to confirm that a black-colored coated film was formed on the surface of the substrate "S'." Note that the sample being obtained in Film-forming No. 8 is labeled #31.

(Film-Forming No. 9 (Comparative Example))

Except that the rod-shaped body 66 was removed and the output of the high-frequency electric power source 7 was set at 180 W (reflection: 30 W), an amorphous carbon film was formed on a surface of the substrate "S'" in the same manner as Film-forming No. 8. Note that the sample being obtained in Film-forming No. 9 is labeled #C3.

Bubbles in the inside of which plasma generated arose from the discharging end 62 of the main electrode 61, and then migrated upward through the liquid "L'" toward a surface of the substrate "S'" On this occasion, arc discharge occurred frequently between the main electrode 61 and the substrate "S'."

Note that the specifications of the electrodes for in-liquid plasma and the distances "D" between the main and auxiliary electrodes in Film-forming No. 1 through Film-forming No. 9 are given in Table 1, respectively.

TABLE 1

| Sample | Protruding Magnitude of Main Electrode "X" (mm) | Type Auxiliary Electrode | Opening Diameter "W" (mm) | Distance "D" between Main and Auxiliary Electrodes "D" (mm) | Distance "d" between Electrode and Substrate "d" (mm) |
|---|---|---|---|---|---|
| #11 | 0 | Cap Shape | 1.0 | 1 | 2 |
| #12 | 0 | Cap Shape | 1.5 | 1 | 2 |
| #13 | 0 | Cap Shape | 1.7 | 1 | 2 |
| #14 | 0 | Cap Shape | 2.0 | 1 | 2 |
| #C1 | 0 | — | — | — | 1 |
| #21 | 0 | Metallic Net | — | 1 | 1.3 |
| #C2 | 0 | — | — | — | 1 |
| #31 | 0 | Rod Shape | — | 2.5 | 3 |
| #C3 | 0 | — | — | — | 3 |

(Film Forming of Amorphous Carbon Film)

Using the in-liquid plasma film-forming apparatus III, amorphous carbon films were formed on a substrate's surface.

(Film-Forming No. 8)

Methanol was made ready as the liquid "L'," and the vessel 81 of the in-liquid plasma film-forming apparatus III was filled with it. Moreover, the electrode 6 for in-liquid plasma was made ready by cutting off a tungsten wire with $\phi 0.3$ mm in wire diameter, which serves as the rod-shaped body 66, to a predetermined length. For the substrate "S'," a plate material comprising high-speed steel (SKH51 (JIS)) was used, plate material it which a through hole "h" with $\phi 0.5$ mm in diameter was formed at the central section.

To begin with, the inside of the outer vessel 91 was depressurized to set the inside-vessel pressure at 200 hPa. Next, the frequency of the output electricity from the high-frequency electric power source 7 was set at 27.12 MHz, and the output was set at 110 W (reflection: 10 W), and then the high-frequency electricity was supplied to the electrode 56 for in-liquid plasma for 1 minute, thereby carrying out film forming. Bubbles in the inside of which plasma generated arose between the main electrode 61 and the rod-shaped body 66 (a In Film-forming Nos. 1 through 4, Film-forming No. 6 and Film-forming No. 8 (Sample #11-#14, #21 and #31), no noticeable arc discharge was seen during the film forming. Specifically, arc discharge was suppressed by carrying out film forming while placing an auxiliary electrode between a main electrode and a substrate. Moreover, in Film-forming No. 6 (#21) and Film-forming No. 8 (#31), a gas-phase space was observed, respectively, gas-phase space which was formed by means of bubbles that were connected to the plasma generating unit continuously because the distance "D" between the main and auxiliary electrodes was set to 1.0-2.5 mm.

(Observations on Amorphous Carbon Films)

Figure 7A:
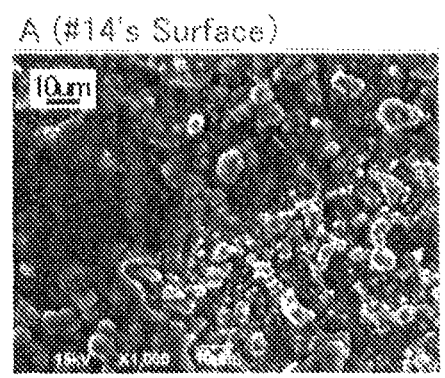
FIG. 7A is an SEM image in which a surface of Sample #14 being obtained in Film Forming No. 4 was observed.
Figure 7B:
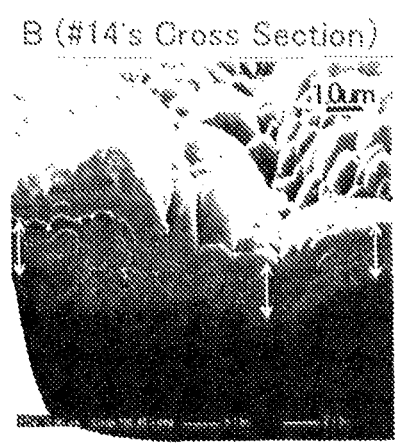
FIG. 7B is an FIB image in which a cross section of Sample #14 was observed.
Figure 8A:
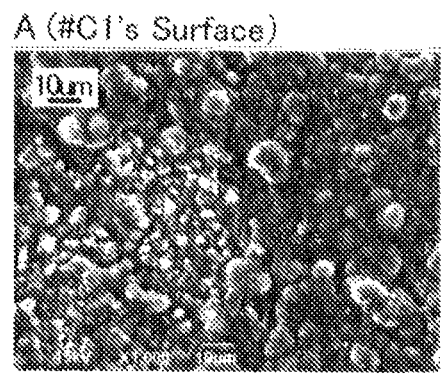
FIG. 8A is an SEM image in which a surface of Sample #C1 being obtained in Film Forming No. 5 was observed.
Figure 8B:
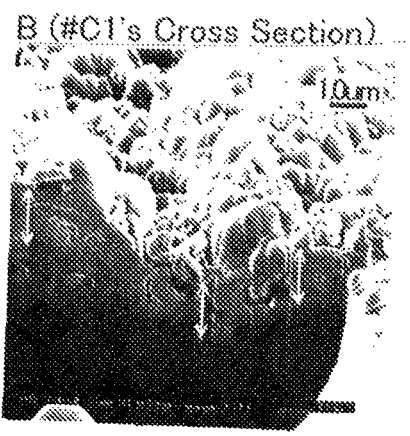
FIG. 8B is an FIB image in which a cross section of Sample #C1 was observed.

With regard to Sample #11-#14, #21 and #31, and with regard to Sample #C1-#C3, a superficial observation, and a cross-sectional observation were carried out. A scanning-electron-microscope (SEM) observation was used for the superficial observation, and a focused ion beam (FIB) method was used for the cross-sectional observation. The results are illustrated in FIG. 4-FIG. 8, FIG. 10, FIG. 11, FIG. 13, and FIG. 14, respectively. Note that, in the respective drawings, "A" is a photograph for specifying the results of the superficial observation by means of SEM, photograph which substitutes a drawing therefor, and "B" is a photograph for specifying the results of the cross-sectional observation by means of FIB, photograph which substitutes a drawing therefor. In the FIB images, the darkest part is the cross section of the substrate "S'," above that is the cross-section of the amorphous carbon film, and the bright part, which is furthermore above that, is the surface of the amorphous carbon film, respectively. In FIG. 7B and FIG. 8B, the range that is designated with the arrows is the cross section of the amorphous carbon film, respectively.

Figure 4A:
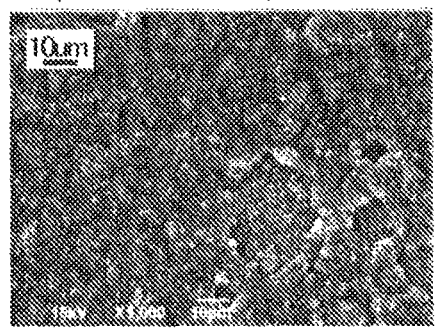
FIG. 4A is an SEM image in which a surface of Sample #11 being obtained in Film Forming No. 1 was observed by means of scanning electron microscope (SEM).
Figure 5A:
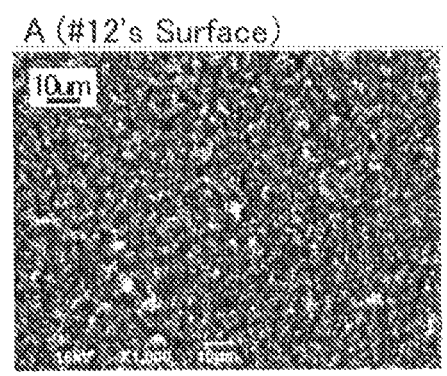
FIG. 5A is an SEM image in which a surface of Sample #12 being obtained in Film Forming No. 2 was observed.
Figure 6A:
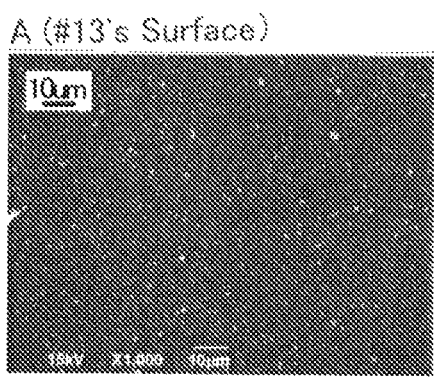
FIG. 6A is an SEM image in which a surface of Sample #13 being obtained in Film Forming No. 3 was observed.

According to the superficial observations on the samples that were obtained in Film-forming Nos. 1-5, it was understood from FIG. 4A (#11), FIG. 5A (#12) and FIG. 6A (#13) that the superficial states were uniform virtually in the respective samples that were made while setting the opening diameter "W" at 1.0 mm, 1.5 mm and 1.7 mm. However, the larger the opening diameter "W" became the more nonuniform the state of the surfaces became; in Sample #14 where the opening diameter was 2.0 mm, a circular dent, which seems to be a discharge mark, was seen in the surface (FIG. 7A). Moreover, in the sample labeled #C1 that underwent film forming without employing the auxiliary electrode 46 as well, dents were observed in the surface (FIG. 8A).

Figure 4B:
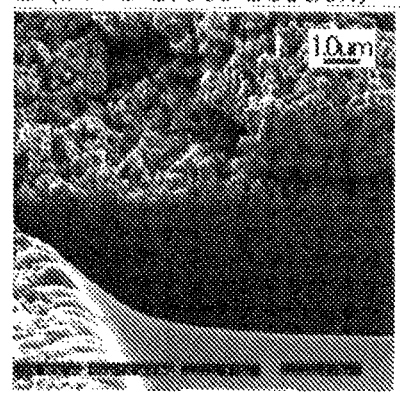
FIG. 4B is an FIB image in which a cross section of Sample #11 was observed by means of focused ion beam (FIB) method.
Figure 5B:
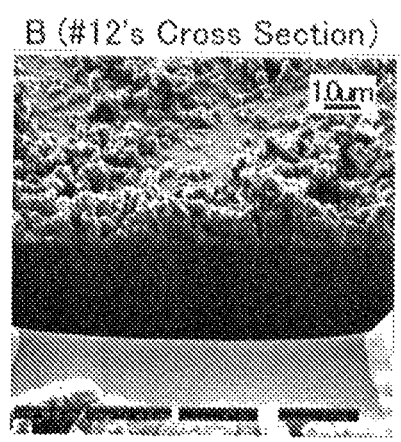
FIG. 5B is an FIB image in which a cross section of Sample #12 was observed.
Figure 6B:
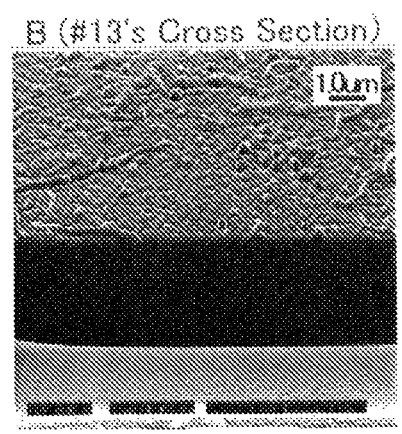
FIG. 6B is an FIB image in which a cross section of Sample #13 was observed.

Moreover, according to the cross-sectional observations, amorphous carbon films with a film thickness of 0.3 μm approximately, which were formed on the surface of the substrate "S'," were observed in the respective samples that were made while setting the opening diameter "W" at 1.0 mm, 1.5 mm and 1.7 mm, as can be seen from FIG. 4B (#11), FIG. 5B (#12) and FIG. 6B (#13). The surfaces of the substrates "S'" were just flat as those prior to the film forming. On the other hand, in Sample #14 where the opening diameter was 2.0 mm, although an amorphous carbon film with a film thickness of 2 μm approximately, which was formed on the surface of the substrate "S'," was observed, minor depressions were seen in the surface of the substrate "S'" (FIG. 7B). Moreover, also in Sample #C1 that underwent film forming without employing the auxiliary electrode 46, although an amorphous carbon film with a film thickness of 2 μm approximately, which was formed on the surface of the substrate "S'," was observed likewise, major depressions were seen in the surface of the substrate "S'" (FIG. 88). That is, it was understood that the occurrence of arc discharge between the substrate and the electrode is suppressed by means of employing an auxiliary electrode; as a result, it was understood that damages to the substrate are reduced.

Figure 10A:
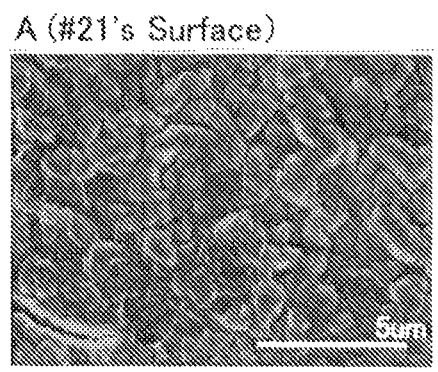
FIG. 10A is an SEM image in which a surface of Sample #21 being obtained in Film Forming No. 6 was observed.
Figure 10B:
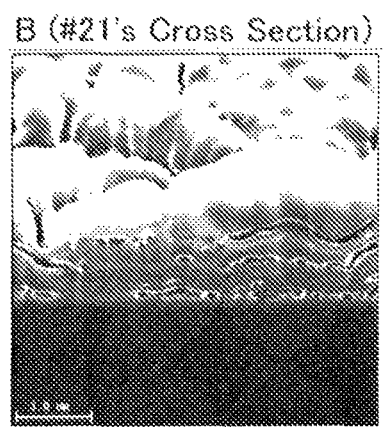
FIG. 10B is an FIB image in which a cross section of Sample #21 was observed.
Figure 11A:
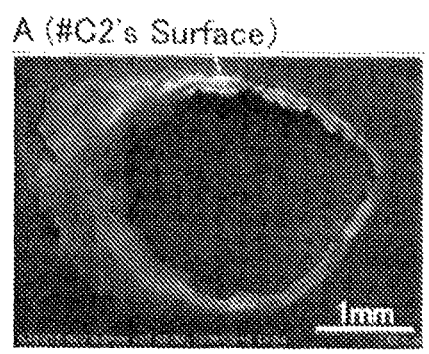
FIG. 11A is an SEM image in which a surface of Sample #C2 being obtained in Film Forming No. 7 was observed.
Figure 11B:
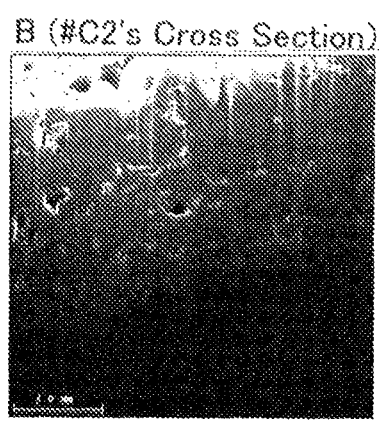
FIG. 11B is an FIB image in which a cross section of Sample #C2 was observed.

In Sample #21 that was obtained in Film-forming No. 6, the amorphous carbon film being shown in FIG. 10A was formed uniformly over the entire surface. Moreover, it was possible to ascertain that an amorphous carbon film with a film thickness of 1 μm approximately was formed on the surface of the substrate that was as flat as the surface of the substrate prior to the film forming, like FIG. 10B. On the other hand, in Sample #C2 that was obtained in Film-forming No. 7, a circular dent, which seems to be a discharge mark, was seen clearly in the surface (FIG. 11A). Moreover, in #C2, it was not possible to observe any flat surface on the substrate even when the cross-sectional observation was done (FIG. 11B).

Figure 13:
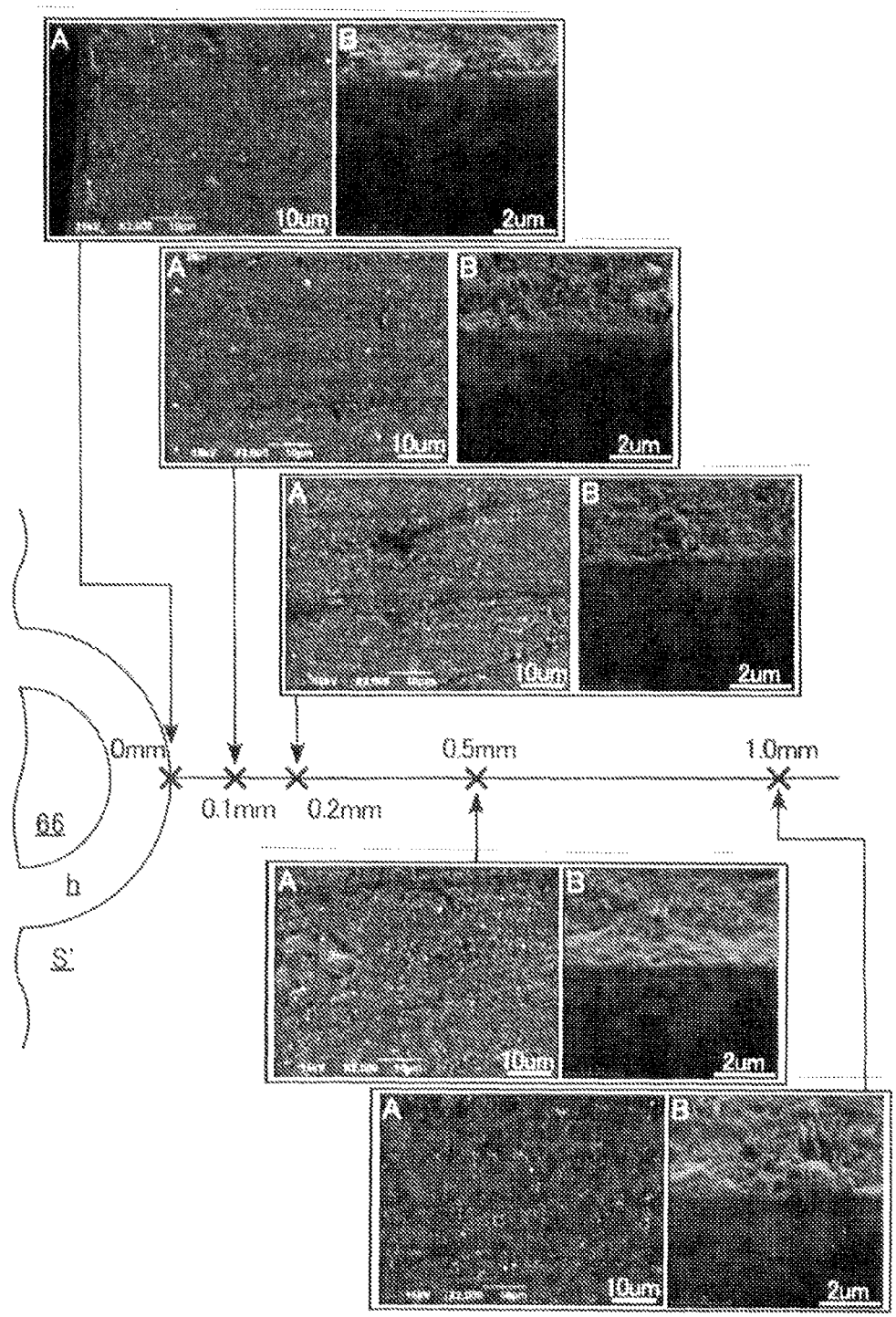
FIG. 13 is SEM images, (A) in which a surface of Sample #31 being obtained in Film Forming No. 8 was observed, and FIB images (B) in which a cross section thereof was observed, and they show five positions (the positions are being specified schematically in the diagram) on the substrate, respectively, positions whose distances from the central part at which an auxiliary electrode was set in place differed.
Figure 14:
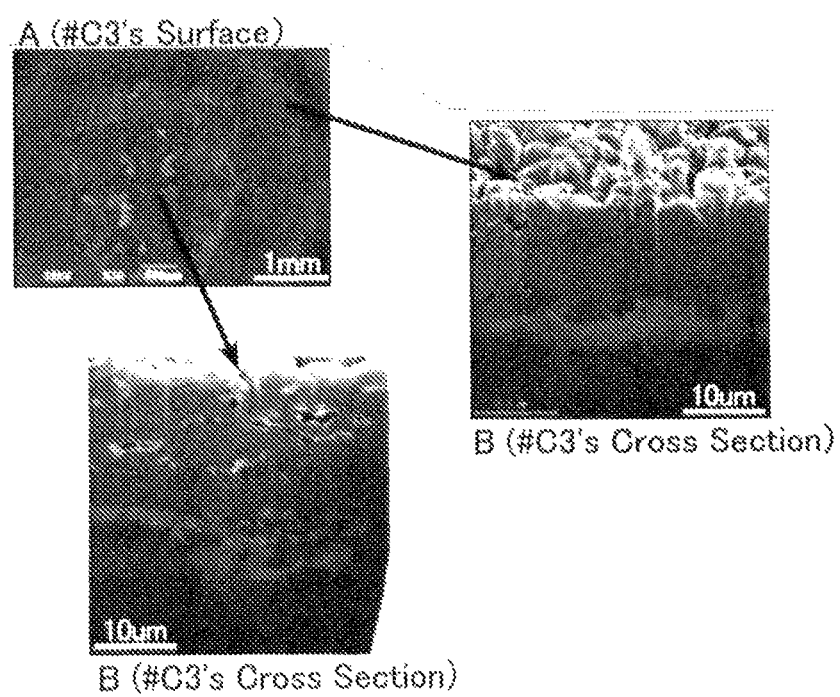
FIG. 14 is an SEM image in which a surface of Sample #03 being obtained in Film Forming No. 9 was observed, an FIB image in which a cross section of the central part was observed, central part in which peeling was seen on the surface; and an FIB image in which a cross section of the peripheral part was observed, peripheral part in which no peeling was seen thereon.

In Sample #31 that was obtained in Film-forming No. 8, an amorphous carbon film with a film thickness of 0.3 μm approximately was formed (FIG. 13). Usually, the more it gets away from the main electrode 61 the lower the possibility of the occurrence of arc discharge is. In FIG. 13, although the observation results at positions are illustrated, respectively, positions which exhibited different distances from the center at which the auxiliary electrode was put in place, the surface of the amorphous carbon film was uniform and damages to the substrate were not seen, either, even at any one of the positions. Specifically, by using the rod-shaped body 66 as an auxiliary electrode, the occurrence of arc discharge was suppressed to the same extent as that in the peripheral part, and accordingly damages to the substrate was also reduced, even at the central part that was close to the main electrode 61. On the other hand, in Sample #C3 that was obtained in Film-forming No. 9, although an amorphous carbon film with a film thickness of 2-3 μm approximately was formed, the amorphous carbon film was seen to come off at the central part of the substrate (or parts that were close to the main electrode 61) (FIG. 14A). And, when observing the cross section of the central part at which the coming-off arose, great irregularities were seen in the surface of the substrate (the left diagram of FIG. 14B). Moreover, even in the cross section of the peripheral part that was separated away from the central part by 2 mm, depressions were seen in the surface of the substrate, and no flat surface could be observed on the substrate (the right diagram of FIG. 14B).

The invention claimed is:
1. An in-liquid plasma film-forming apparatus being characterized in that it has;
   a vessel being capable of accommodating a substrate and a liquid including raw material therein;
   an electrode for in-liquid plasma, the electrode being disposed in the vessel;
   an electric power device for supplying electricity to the electrode for in-liquid plasma; and
   said electrode for in-liquid plasma is equipped with:
   a rod-shaped main electrode having a discharging end that contacts with said liquid, and exhibiting electric conductivity;
   an auxiliary electrode contacting with said liquid, being disposed more adjacently to a side of said discharging end than a position at which said substrate is disposed when taking a position of the discharging end as the standard, and facing the discharging end, the auxiliary electrode exhibiting electric conductivity; and
   a plasma generating unit having a space that is demarcated by a surface of said discharging end and a surface of said auxiliary electrode facing the surface, and being for generating plasma that comprises said raw material inside bubbles, which are formed in the space, by means of electricity being supplied to said main electrode;
   wherein said main electrode is disposed in such a manner that said discharging end is opposite to said substrate;
   said auxiliary electrode is disposed between said substrate and said main electrode;
   at least a part of a surface of said auxiliary electrode and at least a part of said discharging end overlap in an axial direction extending from said main electrode through said space; and
   wherein the bubbles including said plasma that is generated at said plasma generating unit are contacted with said substrate, thereby depositing a decomposed component of the raw material onto a surface of the substrate.

2. The in-liquid plasma film-forming apparatus as set forth in claim 1, wherein said electrode for in-liquid plasma is further equipped with a plasma emitting unit for emitting said bubbles, which include the plasma that have been generated at said plasma generating unit, from the plasma generating unit.

3. The in-liquid plasma film-forming apparatus as set forth in claim 2, wherein said plasma emitting unit is one or more openings, which are provided in said auxiliary electrode and which communicate with said plasma generating unit.

4. The in-liquid plasma film-forming apparatus as set forth in claim 3, wherein said auxiliary electrode comprises a plate-shaped body that has a plurality of through holes, which penetrate in the thickness-wise direction, as said openings.

5. The in-liquid plasma film-forming apparatus as set forth in claim 3, wherein:
said main electrode is equipped with an insulating member that covers the outer periphery excepting the surface of the said discharging end; and said auxiliary electrode has a cap configuration that is put over the discharging end by way of the insulating member.

6. The in-liquid plasma film-forming apparatus as set forth in claim 1, wherein said auxiliary electrode is a rod-shaped body that has a leading end, which faces at least a part of the surface of the said discharging end of said main electrode.

7. The in-liquid plasma film-forming apparatus as set forth in claim 1, wherein said plasma generating unit has a vapor-phase space that is formed by means of said bubbles which connect said space continuously.

8. The in-liquid plasma film-forming apparatus as set forth in claim 1, wherein said main electrode, said auxiliary electrode and said substrate are put in place, respectively, so that a discharge distance at which arch discharge occurs between the surface of the said discharging end of said main electrode and the surface of said auxiliary electrode becomes shorter than a discharge distance at which arc discharge occurs between the surface of the discharging end of said main electrode and the surface of the substrate.

9. The in-liquid plasma film-forming apparatus as set forth in claim 1, wherein said electric power device is a high-frequency electric power device that applies high-frequency electricity to said main electrode.

10. The in-liquid plasma film-forming apparatus as set forth in claim 1, wherein said main electrode and said auxiliary electrode are disposed in such a manner that the distance between opposite surfaces of said main electrode and said auxiliary electrode is within the range of 0.001-100 mm;
said main electrode is disposed in such a manner that the distance between opposite surfaces of said main electrode and said substrate is within the range of 0.001-200 mm; and
said distance between said main electrode and said auxiliary electrode is shorter than said distance between said main electrode and said substrate.

11. The in-liquid plasma film-forming apparatus as set forth in claim 10, wherein said distance between the opposite surfaces of said main electrode and said auxiliary electrode is within the range of 0.1 mm-30 mm.

* * * * *